United States Patent [19]

Gaerttner et al.

[11] 4,256,780
[45] Mar. 17, 1981

[54] METALLIZATION PROCESS

[75] Inventors: Martin R. Gaerttner, Dearborn; David W. Hoffman, Ann Arbor, both of Mich.

[73] Assignee: Ford Motor Company, Dearborn, Mich.

[21] Appl. No.: 55,939

[22] Filed: Jul. 9, 1979

Related U.S. Application Data

[63] Continuation-in-part of Ser. No. 957,373, Nov. 2, 1978, abandoned, and Ser. No. 957,374, Nov. 2, 1978, abandoned.

[51] Int. Cl.³ .............................................. B05D 3/06
[52] U.S. Cl. ...................................... 427/38; 427/251
[58] Field of Search .................. 427/38, 39, 40, 35, 427/248.1, 250, 251

[56] References Cited

U.S. PATENT DOCUMENTS

| | | | |
|---|---|---|---|
| 2,424,043 | 7/1947 | Meyer | 427/35 |
| 2,465,713 | 3/1949 | Dimmick | 427/39 |
| 2,799,600 | 7/1957 | Scott | 427/38 |
| 3,528,387 | 9/1970 | Hamilton | 118/49.1 |
| 3,904,505 | 9/1975 | Aisenberg | 427/39 |
| 3,961,103 | 6/1976 | Aisenberg | 427/39 |

OTHER PUBLICATIONS

EerNisse "J. App. Physics" vol. 48, #8, Aug. 1977, pp. 3337–3341.
Hoffman et al., "Thin Solid Films" vol. 45 (1977), pp. 387–396.
Aisenberg et al., "J. Vac. Sci. Technol.," vol. 10, #1 Jan./Feb. 1973 pp. 104–107.

*Primary Examiner*—John H. Newsome
*Attorney, Agent, or Firm*—Edmund C. Ross, Jr.; Olin B. Johnson

[57] ABSTRACT

Energetic particles modify favorably deposits from sources as evaporant to yield films that have a reduction in tension or even are in compression and with metals as chromium, an increase in reflectance. Only relatively few energetic particles are required to bring about desired change.

18 Claims, 4 Drawing Figures

METALLIZATION PROCESS

This application is a continuation-in-part of U.S. Application Ser. Nos. 957,373 and 957,374 both filed Nov. 2, 1978 both now abandoned.

BACKGROUND OF THE INVENTION

This invention relates to vacuum deposition and includes, in particular, such deposition enhanced by bombardment of its deposits with relatively few energetic particles. Internal stress of the deposits is thereby beneficially altered and controlled and other advantages as, for example, with chromium, high reflectance can result.

U.S. Pat. No. 3,528,387 discloses an apparatus for substrate modification including cleaning that employs evaporant and ion sources. This patent does not suggest alteration of internal stress of deposited films, since its only example is with aluminum, a relatively soft metal, which deposits from vapor without normally evidencing detrimental levels of stress.

U.S. Pat. Nos. 3,904,505 and 3,961,103 disclose apparatus and process that, in one embodiment, employ together evaporant and ion sources for deposition. Stress change of deposits is not stated; and, moreover, the patents (e.g. U.S. Pat. No. 3,904,505 at column 5, lines 29–33) indicate that the ions are of such number as to contact the "neutral film atoms to be deposited" rather than the condensed film.

The article "Physics of Ion Plating and Ion Beam Deposition" by Aisenberg (inventor of U.S. Pat. No. 3,904,505 and 3,961,103 above) et al., J. Vac. Sci., Vol. 10, No. 1, Jan. 1 Feb., 1973 pp. 104–107 discloses concurrent use of evaporant and ion sources for deposition, but no mention is made of advantageous stress alteration thereby.

The article "The Compressive Stress Transition in Al, V, Zr, Nb and W Metal Films Sputtered at Low Working Pressures," by Hoffman (an inventor herein) and Thornton in THIN SOLID FILMS 45 (1977) 387–396 discloses stress alteration through sputtering at low pressures using magetron plasma confinement and also discloses that bias sputtering can alter deposit stress. There is no disclosure in this article of separately actuated sources of vapor and energetic particles.

The article "Stress in Ion-Implanted CVD $Si_3N_4$ Films" by Eernisse in JOURNAL OF APPLIED PHYSICS, VOL. 48, No. 8, August 1977 discloses stress alteration in CVD deposits of $Si_3N_4$ insulators on silicon using ion bombardment but fails to disclose stress alteration in metals, particularly bright metals and concomitant increase in optical reflectance.

It is believed unknown therefore, despite disclosures such as above, that internal stress and other properties as optical reflectance of deposits of metals can be altered by bombarding them with relatively few energetic particles.

THE INVENTION

Figure 1:
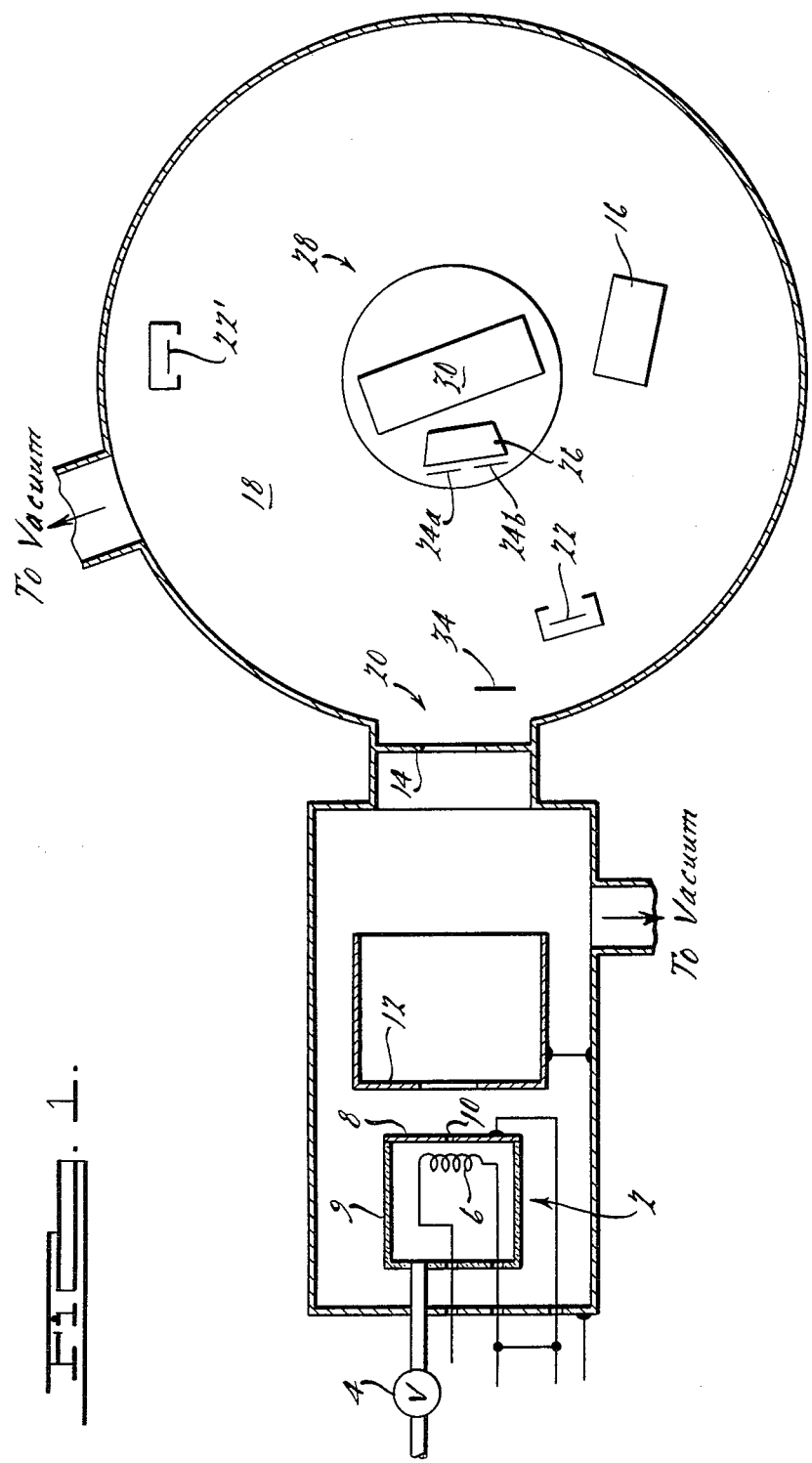
FIG. 1 illustrates schematically an apparatus adapted for use in this invention with separate ion source and evaporative source.

This invention relates to vacuum deposition as metallization from evaporant sources that is enhanced by bombardment of its deposits with energetic particles. An advantageously low ratio of energetic particles to other deposition particles yield, when the energetic particles are sufficiently accelerated, deposits that have desirable internal stress. As few as 1 to 2 energetic particles per 200 deposited particles may bring about desired change (e.g., diminish tensile stress, bring about compressive stress) and even smaller ratios can be employed, if desired.

In deposition of transition metal as chromium vapor that normally deposits in tension, bombardment of its deposits by energetic particles of, for example, inert gas can modify the metal deposit to have compressive stresses comparable in magnitude to tensile stresses that occur without bombardment.

This stress modification is preventative of cracking and peeling of the deposit from the substrate. Furthermore, with metal as chromium, bombardment that causes stress change in the deposit also can improve reflectance.

Since only a few energetic particles per otherwise deposited particle yield desirable modification, substrates as heat resistant plastics may be used without their deformation, degradation and the like, even when relatively thick films, e.g., over 1000 A are deposited.

This invention in one aspect also permits rapid deposition of quality thin metal films on heat sensitive materials by using evaporant source in conjunction with stress modifying level of energetic particles that is below that which causes undesirable substrate heating.

DETAILED DESCRIPTION OF THE INVENTION

A diverse group of materials is depositable from vapor in a vacuum can be employed in accordance with this invention. As these materials or derivatives thereof constitute that which will comprise most, by weight, if not all, of the deposit on the substrate, they will for convenience, be called herein "primary deposition materials."

The primary deposition materials for which this invention is especially applicable are metals which normally form deposits that are in tension from vacuum operations such as by vapor deposition from evaporant sources. Refractory transition metal constitutes one such class of metals and suitable metal may be selected therefrom, particularly for example, for improved optical reflectance when deposition is otherwise with less than desired reflectance from evaporant sources. Thus, suitable metals may include any selected from the following as well as alloys (e.g. stainless steel) based on (or containing) one or more of the following: titanium, vanadium, chromium, iron, nickel, cobalt, molybdenum, platinum, palladium, rare earth as gadolinium, ruthenium, zirconium, rhodium, niobium, osmium, rhenium and other such metals that are of Groups IIIa—VIIa and VIII. Some non-refractory materials may also be used, e.g. aluminum 6061 alloy may also receive desired stress alteration when deposited from vapor.

Of transition metals, first series metals such as chromium illustrate a particular value of this invention. Chromium, and its bright alloys, for example, normally deposit from evaporant sources in an undesired off color and in tension that restrict use from evaporant sources. Other deposits besides those of the first series as chromium that similarly may derive benefit from this invention include niobium, molybdenum, tantalum and gadolinium and alloys based on any of such metals.

In a first embodiment, this invention comprises utilizing deposition from an evaporant source of primary deposition material, e.g., resistively, electron bombarded or otherwise heated source, in a vacuum chamber desirably maintained at levels below about $10^{-2}$ Torr, especially below about $10^{-4}$ Torr, and as is illustrated in FIG. 1. Although any source or sources of vapor or vapors of the primary deposition material including charged species thereof may be used, evaporant sources offer special advantage as to, for example, convenience, power efficiency and rapid deposition.

The precise vacuum pressure during such deposition is not normally a critical feature of this invention. As is understood with any deposition process, however, partial pressures of interfering or deleterious substances (e.g., partial pressure of reactive oxygen during deposition of chromium) should be kept as low as possible. When vapors are inert or desirably included, they may be within the vacuum at varying vapor pressures differing from the above recited average pressures of the vacuum chamber (e.g. vapor pressure of primary deposition material at its source or at its deposition destination).

In this first embodiment, using an evaporant source, a substrate is placed in the vacuum so as to permit contact with the vapor and formation of a deposit on the substrate with the primary deposition material. The substrate may be of conducting or non-conducting material. This invention offers advantage in that heat sensitive substrates as plastics, e.g., those commonly known as "ABS," may be employed when depositing thin films. Advantageously, the substrate may be prepared for deposition by bombardment with energetic particles prior to any vapor deposition. Such prior bombardment can cause a sputtering off of surface contaminants and can provide a more adhering substrate surface.

The order in which the energetic particles bombard the vapor deposit is not critical. Rather, the flux of depositing vapor as well as the flux of energetic particles may be varied as desired. For example, the energetic particles may continuously or intermittently bombard the deposit as it is being built-up. Moreover, the energetic particles may bombard the deposit during a time when it is not being built-up or not being built-up as rapidly as during another time.

In one advantageous manner of still further mitigating substrate heating, if desired, the substrate or sources may be moved relative to one another thereby varying the amount of vapor and energetic particles contacting the substrate with time. Thus, for example, substrate that is to receive deposition of primary deposition material may be rotated, translated or otherwise moved between locations of high vapor flux and high energetic particle flux so as to disassociate, at least in part, heating effects due to each and permit intermediate cooling, if desired. For thick films, such sequential vapor deposition and energetic particle bombardment may advantageously use more than two sources of, or rotation or oscillation between, sources of vapor and energetic particles. Such sequence may be repeated many times, e.g. 100 or more.

One convenient approach is to use, as energetic particles, particles as ions from separately actuated ion sources as ion guns which are conventionally known and commercially available. The ion guns can be external to the chamber wherein vapor deposition occurs and actuated as desired. Ions of inert gas, e.g., krypton, argon, xenon, or primary deposition material, e.g., chromium or even neutral particles or beams, e.g., mixed ions and electrons, or other atoms as nitrogen, may be employed.

At any given energy level in this or other embodiments, a certain amount of experimentation may be required to determine the relative number of energetic particles per particles of primary deposition material for any particular substrate employed in order that the deposit advantageously have desired stress and other physical properties. The final chosen number of energetic particles at any given energy for industrial processes may also depend on secondary factors such as power consumption, deposition and bombardment rate, nature of primary deposition material, bombarding species, substrate material including its capacity to withstand heat, film thickness required and the like. Unless the minimum number for each energy level of bombarding particles per otherwise depositing particles is reached, however, for desired stress change, no significant effect is seen. As before, this minimum number is advantageously low.

It is important, however, that not too high a number of energetic particles at a given energy level be used that would lead to undesired sputtering of the deposited primary deposition material after its deposition. Such sputtering can cause erosion of the deposit surface as well as possible other degradation of film character.

Thus, for example, in concurrent bombardment and vapor deposition processes, upon establishment of the dose of energetic particles at a given energy level that alters stress from tension to compression and provides desirable reflectance, the number of energetic particles should desirably not exceed say be a factor of 20, preferably, a factor of 10 or less, the number of energetic particles that is critical to achieve change from tension to compression.

While experimentation may, as above suggested, be useful for optimal levels of energetic particles, a range of up to about 30 or even less, e.g., about 0.1–5, energetic particles as inert gas ions and the like at about 0.1–30 Kev, per 100 deposited particles of primary deposition material as chromium and its bright alloys, when using an evaporant source of such primary deposition material and separately activated ion gun, is normally sufficient on non-conducting substrates. Higher ratios of energetic particles per otherwise depositing particles may be advantageous if the energetic particles are ions or atoms of the same type as the primary deposition material, especially when at the lower of the recited energies. Moreover, higher energy energetic particles (e.g. 300 Kev) may be used necessitating only lower ratios of energetic particles for desired effect, providing, of course, undue sputtering by the highly energetic particles is not encountered and the deposits are sufficiently thick.

The measurement of internal stresses of deposits can be accomplished by any convenient method as, for example, those reported by D. S. Campbell in "Handbook of Thin Film Technology" Maissel and Glang, eds. p. 21-1, McGraw-Hill. For metals as chromium, a simple comparison (with the eye) is normally adequate to distinguish between (a) deposition as from an evaporant source and (b) deposition modified by energetic particles. This is because chromium and its bright alloys show correlation between reflective brightness and deposition in compression.

A particular advantage of the method of this invention is that no external biasing of the substrate need be made. Rather, the source of energetic particles may be separately actuated at desired levels and directed or otherwise allowed to contact the substrate with deposits of primary deposition material thereon. This separate actuation allows for use of several sources of energetic particles of varying types concurrently or sequentially, if desired, and precise control of film quality, especially on curved substrates.

It is not altogether clear from present evidence whether or not it is the kinetic energy or momentum of the energetic particles that is fundamentally related to stress modification of deposited films. Knowledge of the precise relationship is not, however, necessary for practice of the invention as the ending stress characteristics can be readily controlled by controlling the amount of energetic particles at any given energy level.

An advantageous aspect of this invention is that thick films, e.g., above about 1000 Å thick, as for instance, 2000 Å–20,000 Å or more of chromium or its alloys or other decorative metals on heat resistant or cooled plastic substrate may be deposited. Such thick films can be accomplished, for example, as follows.

Chromium or bright alloy is evaporated into a chamber maintained at pressures in a range below about one millitorr whereupon deposition begins on the plastic substrate in the vacuum. A source of energetic particles, e.g., ions of inert gas, atoms or ions of chromium and the like are introduced into the vacuum to contact chromium deposit as it is being deposited from the evaporant source. The energetic particles required to produce compressive stress increases are desirably at about 0.5–15 KeV or more and the number of energetic particles at these energy levels lies between about 0.2–20 per 100 evaporant atoms of chromium or bright alloy that are in the deposit. The bombarding of the deposits of vapor by the energetic particles is continued until the ending deposit is a thick film as above described and has its stress characteristics showing deposition stress about zero or slightly or even greater in compression as desired for a particular application. Alternatively, the contacting with the energetic particles may be intermittent (e.g. after a 1–5000 Å thick film has been vapor deposited) with similar results.

During the period of deposition no external bias, as previously mentioned, need be applied to the substrate, although, such external bias may, if desired, be applied.

The following examples are provided to illustrate certain aspects of this invention as previously described and is not intended as limiting the scope of this invention.

EXAMPLE 1

FIG. 1 illustrates in schematic fashion an arrangement of apparatus that may be used to deposit films in accordance with this invention.

In this apparatus, a Calutron ion source 2 is used to produce energetic particles as ions. The gas to be ionized enters the chamber of the source 2 through a needle valve 4 which adjusts flow so that the gas pressure within the chamber 2 is in the 5 to 100 millitorr range. The pressure within the rest of the vacuum system is kept below $2 \times 10^{-4}$ Torr to prevent undesirable loss of ion beam current and to prevent incorporation of impurity gas atoms within the films being grown.

An arc is established between the resistively heated filament 6 (partially surrounded by ceramic insulator 9) and the anode 8 of the ion source, providing a dense plasma in the vicinity of the filament and anode. Ions are extracted from this plasma through an aperture 10 in the ion source and accelerated to a desired energy, (e.g. 1 to 15 KeV) by applying a positive voltage on the ion source relative to the grounded extraction lens 12. The ions drift through the extraction lens and through other ion optics (not shown, but located between extraction lens 12 and aperture 20) into the chamber of the vacuum system 18. An aperture 20 is used to limit the extent of the ion beam within the chamber.

A resistively heated source 22 (power supply not shown) provides a controlled rate of deposition of, for example, chromium onto a pair of substrates 24a and 24b on substrate holder 26 mounted on a rotatable carousel 28 (the rotary vacuum feedthrough and mechanical linkage is not shown). By rotating the carousel the ion beam may strike either or both of the substrates. An ion collector 30 may be rotated into proper orientation to monitor the ion beam current. By measuring this current, which is usually kept constant in this example, the flux of ion bombardment upon a substrate may be determined. Device 16 is a quartz crystal film monitor.

The ion beam collides with one of the substrates 24a while at the same time chromium is being evaporated onto the pair of substrates. The second substrate 24b accumulates approximately the same chromium deposit as substrate 24a; however, for comparison purposes substrate 24b does not get bombarded with ions. The movable shutter 34 (mechanical linkage not shown) permits control of which substrate is bombarded with ions.

Figure 2:
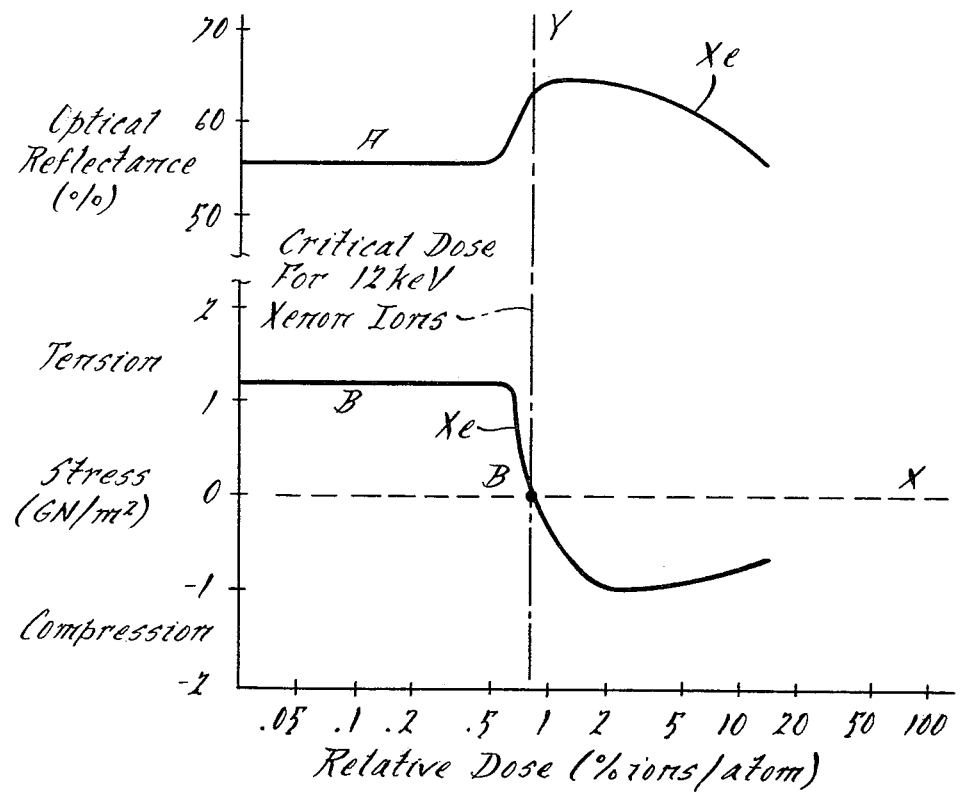
FIG. 2 illustrates graphically results of Example 1 by showing stress change along with reflectance change for chromium deposits that are bombarded with varying numbers and energy levels of energetic particles.

FIG. 2 illustrates graphically the results of deposition of chromium on glass (rate of about 3 Å/second) using the above described apparatus in accordance with the invention. The X axis is percent of ions bombarding the vapor deposited metal on the substrate. The Y axis is optical reflectance for curve A and stress for curve B.

From curve A it may be seen that reflectance is beneficially altered by certain doses of 12 Kev ions of xenon. From curve B it can be seen that stress is also altered by certain dose of xenon, energetic ions at 12 Kev.

By comparing curves A and B, it can be seen that optical brightness also correlates with deposition of film in compression at the same ratios of energetic particles at the same energy level.

The film thicknesses of chromium in this Example are approximately 2000 Å. The absolute dose in FIG. 2 is unsertain and the critical dose could be ⅜ less than the 0.9% indicated. The dose is relative in FIG. 2 and the purpose of this FIG. 2 is to illustrate optical reflectivity change of the same dose at which stress becomes compressive.

EXAMPLE 2

Using the procedures of Example 1, bombardment is with argon ions rather than xenon ions. Also, the temperatures of the substrates bombarded are monitored and controlled. Temperature control (60° C.) of substrates bombarded is with heat sink to a massive copper block using liquid gallium - indium eutectic. "Hot substrates" are glass allowed to warm up to combined power input to the substrates (e.g. from radiation, ion beam current, and chromium condensation). It is estimated that the "hot substrate" temperature exceeds 200° C.

Figure 4:
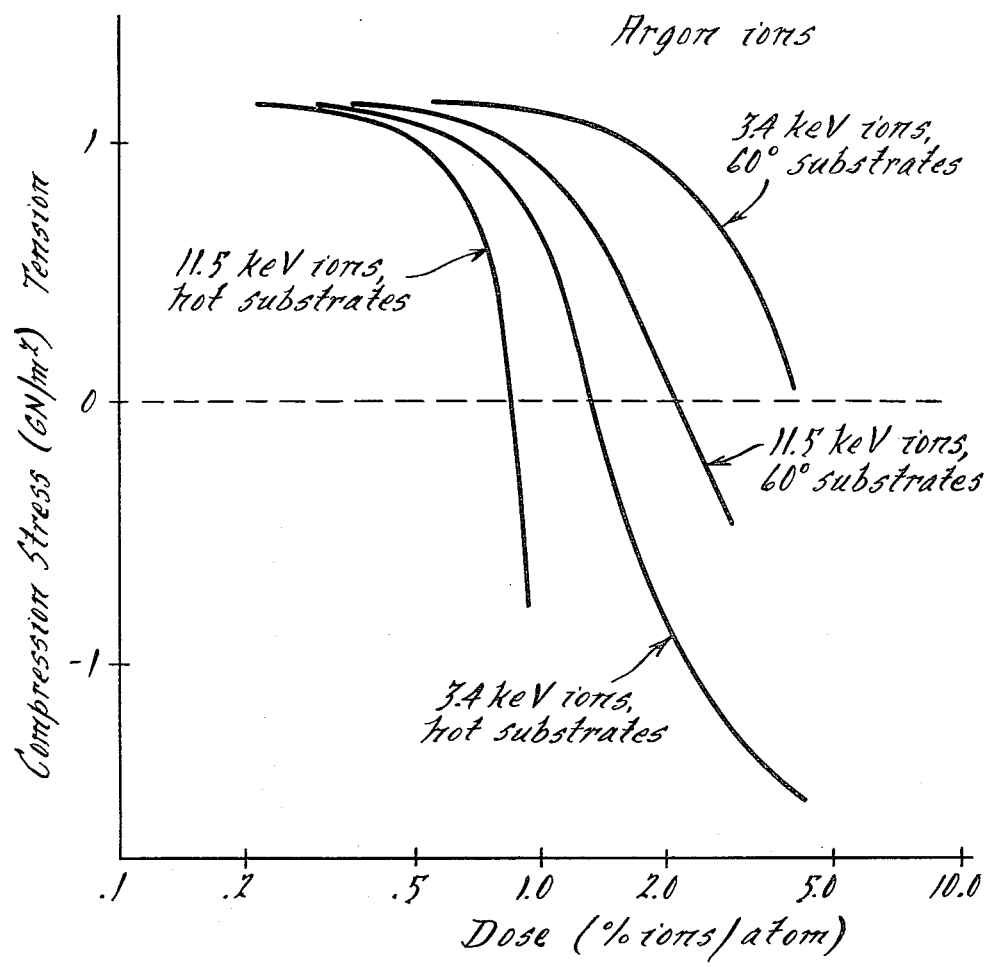
FIG. 4 illustrates schematically another apparatus for use in this invention with separate ion and evaporative sources.

FIG. 4 shows results of dose (ions per 100 deposited atoms) versus internal stress of chromium films at the different temperatures. The results are shown with smooth curves which are estimated from data points that are not greater than ± 25% from the curve. Stress is determined as noted above.

EXAMPLE 3

The ions of xenon at 12 KeV of Example 1 are replaced by ions of chromium and the procedures of Example 1 using the apparatus of FIG. 1 are repeated with similar results.

EXAMPLE 4

The procedures of Example 1 are again followed with respect to ion-modified deposition using the apparatus of FIG. 1 except that the vapor deposition and ion bombardment are conducted sequentially by permitting a buildup of 200 Å layers of chromium before beginning bombarding with the ions of inert gas. The percent of ions bombarding the 200 Å layers of chromium is varied in accordance with FIG. 2. The results show similarly desirably improved stress and reflectance at critical doses.

EXAMPLE 5

The procedures of Example 1 are followed except that alternative evaporative source 22' is employed rather than source 22 and the movable shutter 34 is not used. Carousel 28 is filled with several spaced substrates and is rotated to provide alternating vapor deposition and ion bombardment for the substrates as it rotated. Desirable stress and brightness are seen with chromium deposition modified by argon ions at 12 KeV.

EXAMPLE 6

Figure 3:
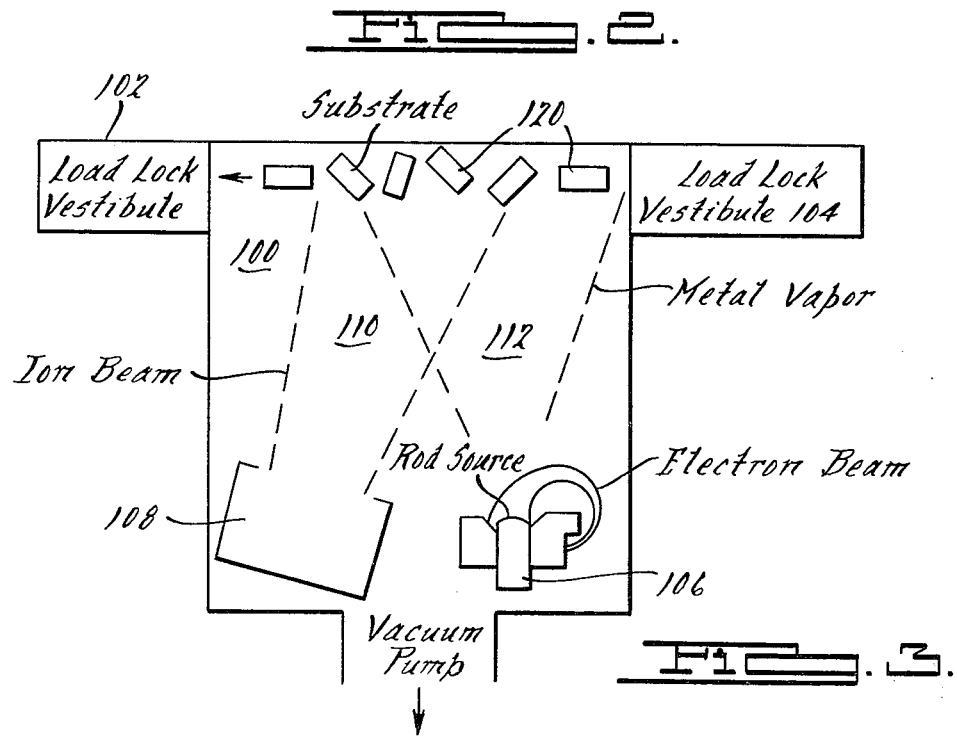
FIG. 3 illustrates graphically results of Example 2 and shows effect of substrate temperature on stress of deposited film.

FIG. 3 illustrates a coating apparatus for deposition onto a large area at high rates on stationary or moving (translated and/or rotating) substrates or parts. The components shown are:

1. Industrial-sized diffusion pumped vacuum chamber 100 with capability for pressure maintenance at or below $10^{-3}$ torr; provision for continuous or semicontinuous introduction and removal of workpieces to be coated by means of separately pumped vestibules 102 and 104 and vacuum gate valves (not shown); fixturing (not shown) for translation and/or rotation of workpieces 120 through the chamber. 2. High-rate electron beam heated evaporator 106 with continuous introduction of evaporant 112 by rod feed that has evaporation capacity on the order of 0.1-10 cc of metal per minute per source. 3. Ion beam source 108 of ion-milling type (large area, high current density, neutralized beam) that provides 0.5 milliamp/cm² of ionized argon 110 over 30 centimeter diameter. (Apparatus can employ multiple evaporation and ion sources to cover enlarged areas as desired). Operating parameters are adjusted to obtain high rate deposition with sufficient dose of accelerated ions to produce compressive-bright films accordingly as in Example 1 and as hereinbefore described. Owing to the sharp-transition nature of the phenomenon (see FIG. 2) it is not necessary that the ion dose be everywhere uniform, but only that it exceed (but desirably not by more than a factor of 15) the minimum required dosage, as determined in specific application by examination of film quality.

What is claimed is:
1. A deposition process, which comprises:
(A) maintaining a vacuum in a chamber;
(B) providing a substrate in the chamber;
(C) providing depositable vapor comprising transition metal in the vacuum from a vapor source, the vapor normally depositing in tension;
(D) permitting the vapor to contact the substrate to cause a deposit thereon; and
(E) bombarding the deposit with accelerated particles comprising energetic, atomic particles from another source that are sufficient in number and energy so that the internal stress of the deposit is about zero or in compression.
2. The process in accordance with claim 1 wherein the vapor comprises chromium or any of its bright alloys.
3. The process in accordance with claim 1, wherein the bombarding continues as the deposit is built-up.
4. The process in accordance with claim 1, wherein the bombarding and the vapor contact are sequential.
5. The process in accordance with claims 3 or 4, wherein the substrate comprises plastic and the vapor comprises chromium or any of its alloys.
6. The process in accordance with claims 3 or 4, wherein the energetic particles comprise ions of inert gas.
7. The process in accordance with claim 6, wherein the ions have an energy between about 0.1-30 KeV.
8. The process in accordance with claim 7, wherein the ratio of ions to atoms of vapor is in the range between about 0.1:100-30:100.
9. The process in accordance with claim 1, wherein the energetic particles comprise ions of transition metal.
10. The process in accordance with claim 1, wherein the deposit is in compression after bombardment.
11. A deposition process, which comprises:
(A) maintaining a vacuum in a chamber;
(B) providing a substrate in the vacuum;
(C) providing depositable first series transition metal vapor in the vacuum from a first source that normally provides deposits that are in tension;
(D) permitting the vapor to contact the substrate to cause a deposit thereon;
(E) bombarding the deposit with accelerated particles comprising energetic, atomic particles sufficient in number and energy so that the internal stress of the deposit is about zero or in compression.
12. The process in accordance with claim 11, wherein the substrate comprises plastic.
13. The process in accordance with claim 12, wherein the metal comprises chromium or any of its alloys.
14. The process in accordance with claims 11 or 12 or 13 wherein the energetic particles comprise ions.
15. The process in accordance with claim 14, wherein the ions comprise chromium ions.
16. The process in accordance with claim 14, wherein the ions comprise ions of inert gas.
17. A deposition process, which comprises:
(A) maintaining a vacuum in a chamber;
(B) providing a plastic substrate in the chamber;
(C) providing depositable vapor comprising chromium in the vacuum from a vapor source;

(D) permitting the vapor to contact the substrate to cause a deposit thereon;

(E) bombarding the deposit with accelerated ions from another source that are sufficient in number and energy so that the internal stress of the deposit is about zero or in compression and its optical reflectance is above about 60%.

18. In a deposition process, which comprises:

(A) maintaining a vacuum in a chamber;

(B) providing a substrate in the chamber;

(C) providing depositable vapor in the vacuum from a vapor source;

(D) permitting the vapor to contact the substrate to cause a deposit thereon; and (E) bombarding the deposit with accelerated particles comprising energetic, atomic particles from another source that are sufficient in number and energy to alter the internal stress of said deposit, the improvement which comprises providing a first vapor location of high vapor density and a second energetic particle location of high energetic particle density and moving any of the substrate and the locations of high vapor and energetic particles densities relative to one another to cause a sequential exposure of the substrate to the high vapor density and the high energetic particle density so that the deposit has an internal stress about zero or in compression.

* * * * *